(12) United States Patent
Ulriksson

(10) Patent No.: US 7,793,201 B1
(45) Date of Patent: Sep. 7, 2010

(54) BIT ERROR DETECTOR FOR ITERATIVE ECC DECODER

(75) Inventor: Bengt A. Ulriksson, Milford, MA (US)

(73) Assignee: Seagate Technology LLC, Scotts Valley, CA (US)

( * ) Notice: Subject to any disclaimer, the term of this patent is extended or adjusted under 35 U.S.C. 154(b) by 916 days.

(21) Appl. No.: 11/620,400

(22) Filed: Jan. 5, 2007

Related U.S. Application Data

(60) Provisional application No. 60/747,045, filed on May 11, 2006.

(51) Int. Cl.
 *H03M 13/03* (2006.01)
(52) U.S. Cl. .................. 714/794; 714/752; 714/758
(58) Field of Classification Search .......... 714/752, 714/758, 794
See application file for complete search history.

(56) References Cited

U.S. PATENT DOCUMENTS

| | | | |
|---|---|---|---|
| 6,633,856 B2 | 10/2003 | Richardson et al. | |
| 6,686,853 B2 * | 2/2004 | Shen et al. | 341/50 |
| 6,938,196 B2 | 8/2005 | Richardson et al. | |
| 2005/0235195 A1 * | 10/2005 | Choi et al. | 714/800 |

* cited by examiner

*Primary Examiner*—Sam Rizk
(74) *Attorney, Agent, or Firm*—Westman, Champlin & Kelly, P.A.

(57) ABSTRACT

An iterative decoder includes at respective variable nodes, that is, at nodes that correspond to the bits of the code word, bit error detectors that after convergence determine if the respective hard decision bit values have changed from the bit values provided by the channel. The change in value for a given bit indicates that a bit error has been corrected. The bit error detector, for message-passing decoders that perform calculations by addition rather than multiplication, can be readily implemented as an XOR gate. Thus, a bit error is detected at the variable node by XOR'ing the sign bits of the input symbol and the variable node sum. After convergence, the output values produced by the bit error detectors at the respective variable nodes are added together using an adder tree that accumulates the detected bit errors for an entire date block, or ECC code word. Alternatively, the system may group the bits into respective code word symbols and combine the bit error values into symbols-with-errors values using, for example, XOR sub-trees that produce, for each symbol, a single error value. The error value for a given symbol indicates that the symbol is either error-free or includes one or more bit errors, and a total count of the symbols with errors is produced by adding the error values together.

20 Claims, 4 Drawing Sheets

BIT ERROR DETECTOR FOR ITERATIVE ECC DECODER

CROSS-REFERENCE TO RELATED APPLICATION

The present application claims the benefit of U.S. Provisional Patent Application Ser. No. 60/747,045, which was filed on May 11, 2006, by Bengt Ulriksson for a BIT ERROR DETECTOR FOR ITERATIVE ECC DECODER and is hereby incorporated by reference.

BACKGROUND OF THE INVENTION

1. Field of the Invention

The invention relates generally to iterative error correction code (ECC) decoders and, more particularly, to systems and methods for determining bit error rates associated with the iterative ECC decoding.

2. Background Information

Many applications utilize error correction codes (ECCs) to protect data prior to transmitting or storing the data. Data storage systems traditionally use Reed-Solomon is codes, which operate in a pipelined fashion to encode the data quickly and reliably. The data storage systems manipulate the data in the form of multiple bit data symbols in accordance with the Reed-Solomon codes to produce ECC redundancy symbols. The ECC redundancy symbols are then concatenated with the data symbols to form code words, which are written to, for example, the sectors of a disk.

To retrieve the stored data, a disk drive reads the code word from the disk sector and decodes the code word in accordance with the Reed-Solomon code that was used to encode the data. The system thus encodes the retrieved code word data symbols and generates redundancy symbols. The system then manipulates the generated redundancy symbols and the retrieved code word redundancy symbols to produce associated error syndromes and report the number of code word symbols that contain errors. Assuming the number of erroneous symbols is within the error correction capability of the code, the system manipulates the error syndromes to correct the symbols. If the number of erroneous symbols exceeds the error correction capability of the code, the code word may be re-read from the sector and again decoded one or more times. Generally, various known techniques are used in attempts to acquire a better or stronger read signal from the disk, and thus, more accurate detection of the recorded data. If the attempts at decoding fail, however, the data are lost.

The errors in the code word symbols may be caused by a degradation in the disk surface, which results in a corruption of the read-back signal. To avoid losing data, the disk drive typically monitors the health of the disk surface by keeping track of the number of symbols with errors for a given sector. The number of symbols with errors is a metric that is available directly from the Reed Solomon decoding. If this metric has a rising trend, it indicates that the disk surface at the sector is most likely degrading. When the number of symbols with errors for a given sector rises to exceed a predetermined threshold, the disk drive "re-vectors" the data, that is, the disk drive stores the code word in a different location on the disk. The pre-determined threshold is selected to be sufficiently below the error correction capability of the ECC, to ensure that the data are re-vectored before the degradation results in the loss of the data.

Iterative ECCs, such as low density parity check (LDPC) codes, provide improved performance over traditional Reed Solomon codes for disk drive applications. However, there has been a reluctance to adopt the LDPC codes. This is due, in part, to the increased complexity of the LDPC encoding/decoding systems and also to the differences in operating characteristics of the iterative codes versus the traditional Reed-Solomon codes. The widely-used and time tested metric for monitoring the health of the disk surface, namely, the number of symbols with errors per sector, is not reported from the iterative ECC decoding operations. Instead, the iterative LDPC codes have as a metric the number of iterations performed until convergence.

Accordingly, to help alleviate the reluctance to using iterative ECC decoding, what is needed is a mechanism that produces for the iterative decoding a metric that corresponds to the known metric of the number of symbols with errors that is used by applications that employ the traditional Reed-Solomon ECC decoding.

SUMMARY OF THE INVENTION

The inventive system is an iterative decoder that includes at respective variable nodes, that is, at nodes that correspond to the bits of the code word, bit error detectors that after convergence determine if the respective hard decision bit values have changed from the bit values provided by the channel. The change in value for a given bit indicates that a bit error has been corrected.

Message-passing decoders, such as LDPC decoders, typically use log-likelihood ratios, so that calculations can be performed by addition rather than multiplication. Thus, variable nodes add the input symbols received from the channel with the various messages received from code or check nodes, to produce variable node sums. Each variable node sum consists of a one-bit sign value and multiple bits that consist of an associated likelihood ratio or probability information. At convergence, the hard decision for a given bit is the sign bit of the associated variable node sum. Thus, after convergence a bit error is detected at the variable node by comparing or adding the sign bits of the input symbol and the variable node sum, to determine if the bit value was corrected. The detector may thus consist of an XOR gate.

The output values produced by the bit error detectors at the respective variable nodes are counted by, for example, adding them together using an adder tree that accumulates the detected bit errors for an entire date block, or ECC code word. The accumulated total, or bit error count, is then retained as an indication of the health of the sector from which data were retrieved. When the bit error count exceeds a predetermined threshold, the system re-vectors the data to another location on the disk.

Alternatively, the system may group the bits into respective code word symbols and combine the bit error values into symbols-with-errors values using, for example, adder sub-trees that produce, for each symbol, a single error value. The error value for a given symbol indicates that the symbol is either error-free or includes one or more bit errors. The system then counts, or adds together, the error values, to produce a total that corresponds to the number of symbols with errors in the block. The system next determines if the count exceeds a predetermined threshold associated with the symbols with error metric to determine if re-vectoring is required.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
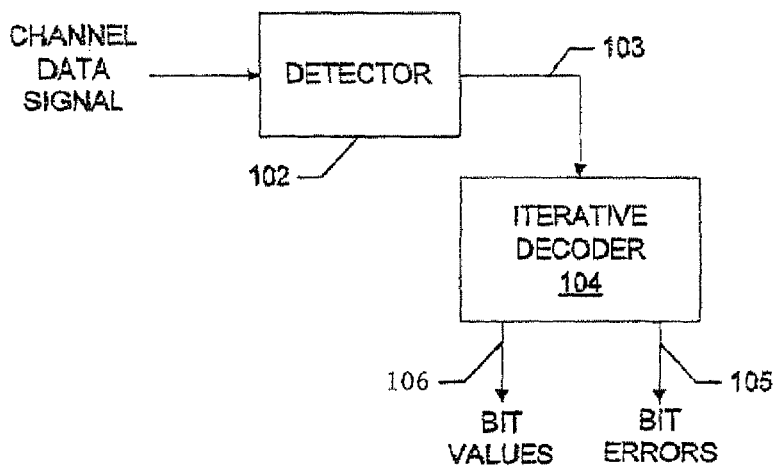
FIG. 1 is a functional block diagram of a system that includes a message-based iterative decoder that is constructed in accordance with the invention.

Referring to FIG. 1, a data signal from a channel is supplied to a channel detector 102, for example, an ISI detector. The detector operating in a known manner detects bits in the data signal and, for each bit, produces an input symbol that consists of a one-bit assigned value, or sign, and multiple bits of associated confidence information. The detector provides the input symbol on line 103 to an iterative decoder 104 which, in the example, is a low-density parity check (LDPC) decoder. The LDPC decoder, which is described in more detail below with reference to FIGS. 2-4, iteratively decodes the input symbols to produce associated hard decision bit values on line 106 and, on line 105, a performance metric that is the number of bit errors per block. Alternatively, the performance metric may be the number of symbols with errors, as discussed in more detail with reference to FIG. 6 below.

Figure 2:
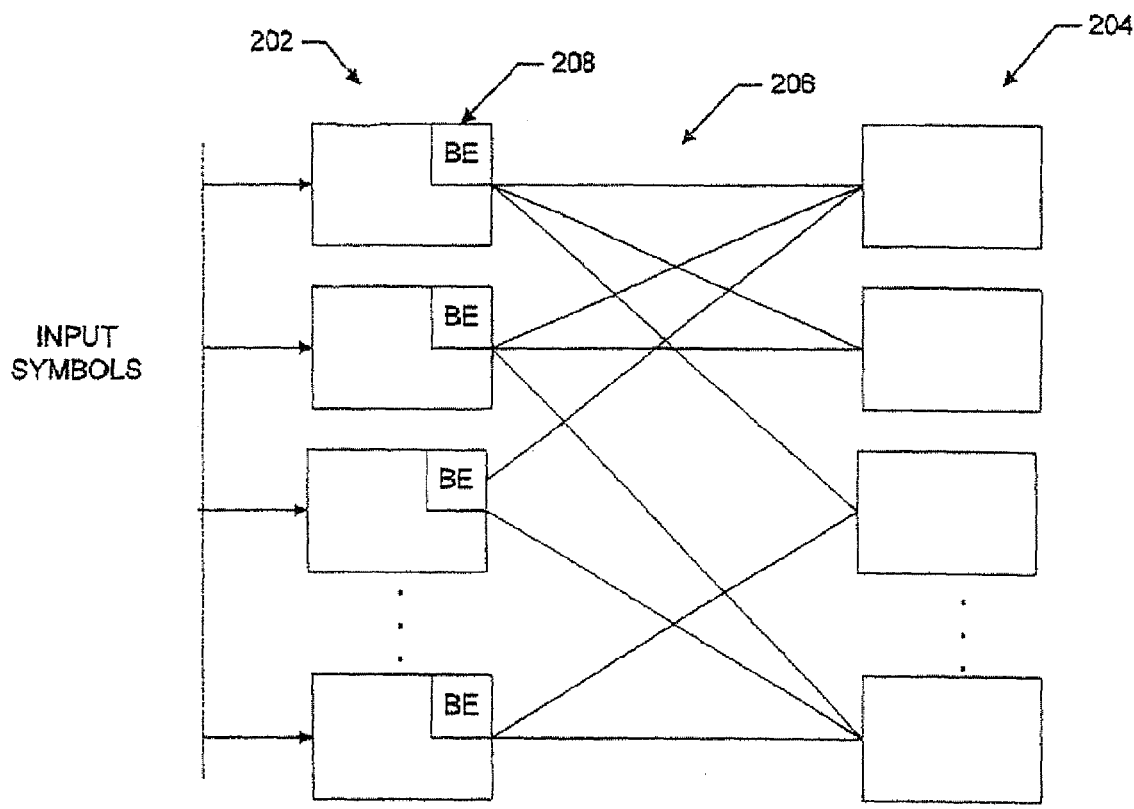
FIG. 2 is a graphical representation of the message-based iterative decoder included in the system of FIG. 1.

Referring now also to FIG. 2, the LDPC decoder 104 performs message-based iterative decoding in accordance with the constraints of the LDPC code used to encode the data. The decoder is represented graphically in FIG. 2 by variable nodes 202 that correspond to the code word bits and check nodes 204 that correspond to the constraints of the code. The variable nodes and check nodes communicate with one another in a known manner, as illustrated in the drawing by paths, or edges, 206. Each variable node 202 operates in a known manner to produce an associated variable node sum that is based on the input symbol from the detector 102 and the messages received from the check nodes. The check nodes, which also operate in a known manner, receive from the variable nodes messages that include confidence information. The check nodes manipulate the information and produce, for a next iteration, related messages that are sent back to the variable nodes. The decoder iteratively updates the variable node sums and the messages in a known manner, until convergence is reached or another stop condition occurs.

A bit error detector 208 determines for a given associated variable node if the sign bit of the input symbol and the sign bit of the variable node sum agree or differ. If the sign bits differ, the bit error detector detects that a bit error has been corrected, and thus, that the reading of the data resulted in a bit error. The number of bit errors is calculated concurrently with each iteration. The result is invalid until the final iteration has finished, that is, until convergence, but the concurrent operation avoids one additional iteration for the sole purpose of calculating the number of bit errors.

Figure 3:
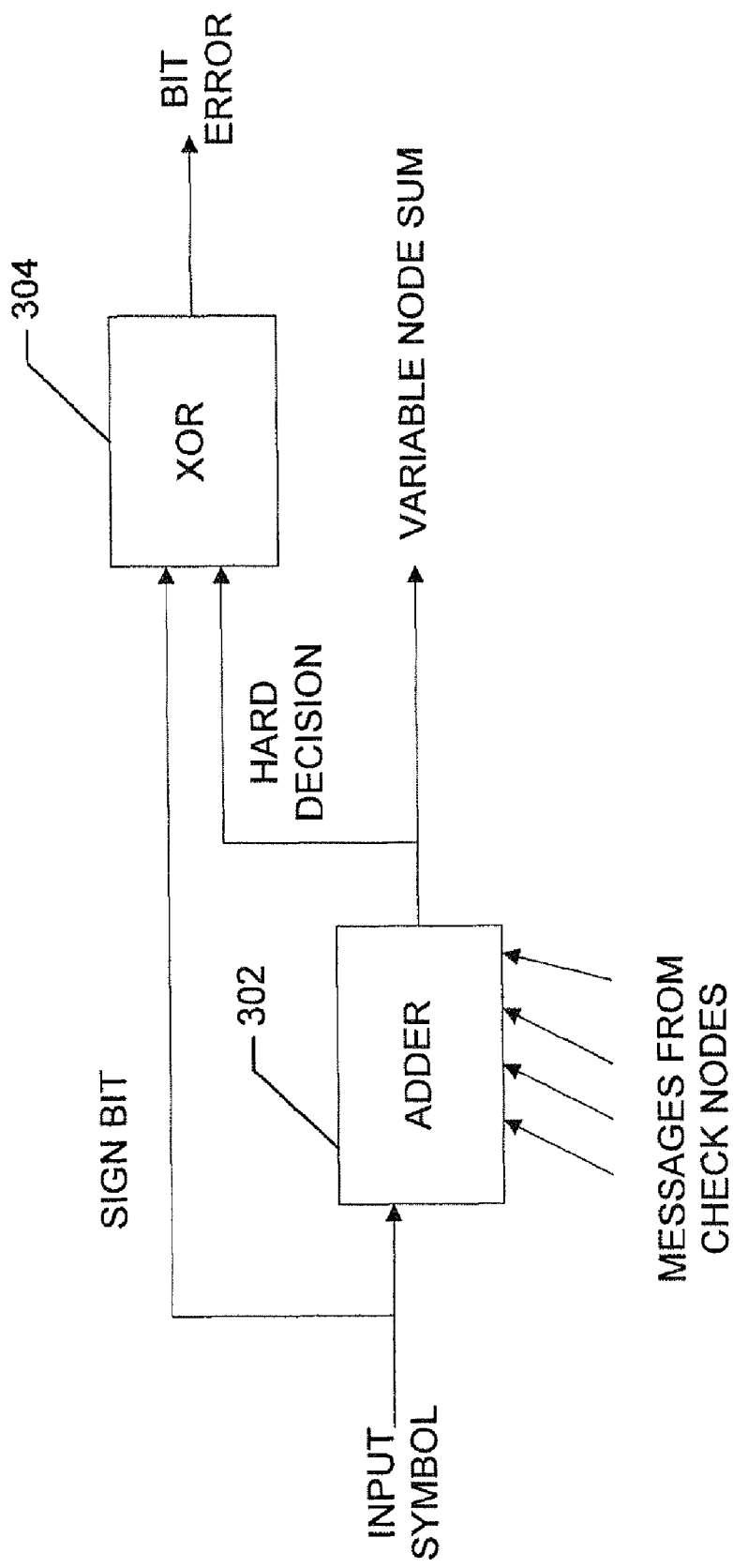
FIG. 3 is a functional block diagram of a variable node included in the iterative decoder of FIG. 2.

Referring also to FIG. 3, the confidence information is in the form of log-likelihood ratios, such that operations performed by the variable nodes 202 in calculating the variable node sums are performed as addition instead of multiplication operations. Thus, the variable node includes accumulator 302 that combines the input symbol from the detector 102 and the messages received from the check nodes 204, to produce the variable node sum. One bit of the variable node sum, typically the first bit, is a sign bit that indicates whether the bit has been determined to be a 1 or a 0. Similarly, one bit of the input symbol, typically the first bit, is a sign bit that represents the bit value detected by the detector 102. After convergence, the sign bit of the variable node sum is the hard decision. The bit error detector 208 may thus be implemented as an XOR gate 304, which after convergence essentially compares the sign bits of the input symbol and the variable node sum, that is, the hard decision, by adding them together. If the two bits match the XOR gate output is de-asserted. If the two bits differ the output is asserted, to indicate that a bit error has been corrected, and thus, that a bit error occurred.

Figure 4:
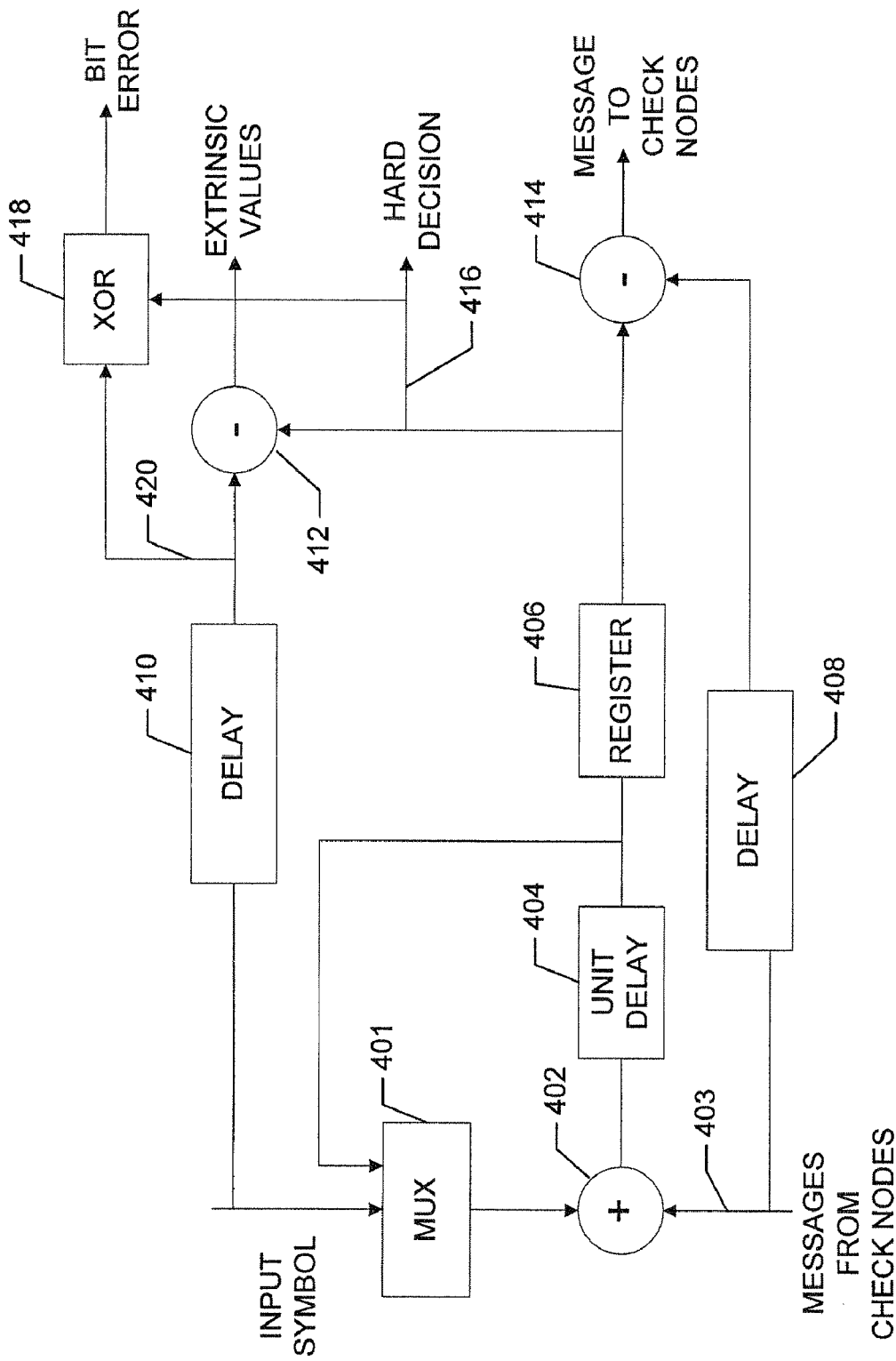
FIG. 4 is a functional block diagram of an alternative variable node included in the iterative decoder of FIG. 1.

Referring now also to FIG. 4, an alternative iterative decoder 104 uses a combination of parallel and serial processing to minimize complexity while providing the necessary computational resources. A fixed number of the variable node processors 202 operate in parallel, and receive messages in serial form from a number of check node processors 204. In the example, each variable node processor receives four check node messages for inclusion in a given variable node sum. Accordingly, four clock cycles are required to calculate the sum. Further, to take advantage of the four clock cycles to process the check messages, four check node processors are combined into a "cluster," such that efficiency can be obtained by sharing resources within the cluster. The memory interfaces, for example, can be shared over the cluster as can the subtractor that generates the extrinsic values.

The input signal from the detector 102 (FIG. 1) is provided through a multiplexer 401 to an adder, or accumulator, 402. The accumulator adds the input signal to a message received from a first check node over line 403. The result is fed back through a unit delay 404 to the multiplexer, and the sum is combined with a message from a next check node over line 403. The accumulation process is repeated until messages that are serially received from the four associated check nodes are combined with the input symbol. As discussed, the number of messages that are combined with the input symbol is determined in accordance with the constraints of the code used to encode the data. Accordingly, more or fewer messages from check nodes may be combined with the input symbol to produce the variable node sum. In the drawing, unit delay, or register, 404 is included so that the operations of the accumulator can be coordinated with the receipt of the messages from the check nodes.

The messages from the check nodes are also supplied to a delay 408, and the input symbol is supplied to a delay 410. The outputs of the delay 408 and the delay 410 are supplied to subtractors 412 and 414, respectively, such that the variable node sum, which is contained in register 406, is manipulated to produce both an extrinsic value and the return messages for the check nodes.

Specifically, the subtractor 414 removes from the variable node sum the messages received from the respective check nodes, to avoid the adverse effects of "positive feedback" on the decoding. Thus, the return message to the first check node is the variable node sum minus the message received from the first check node. The return message for the second check node is the variable node sum minus the message received from the second check node, and so forth. For convenience, the circuitry that produces the clock signals required for these operations is omitted from the drawing.

Further, the sign bit of the variable node sum is provided on line 416 as the hard decision. The sign bit of the input symbol is also supplied to the XOR gate 418 over line is 420. After convergence, the output signal from the XOR gate signals if a bit error has been corrected. If the two bits supplied to the XOR gate differ, the output line of the XOR gate is asserted to indicate a bit error. Otherwise, the output line of the XOR gate remains deasserted.

The subtractor 412 subtracts the input symbol from the variable node sum, to produce an extrinsic value that may be used, in a known manner, by the detector 102 (FIG. 1) during error recovery operations, that is, after a stop condition has occurred.

The decoder, in a known manner, checks for convergence after each iteration. During each iteration, the system counts, or adds together, the bit error values produced by the respective bit error detectors 208, to produce a bit error count. A correct bit error count is obtained during the final iteration when convergence is detected.

Figure 5:
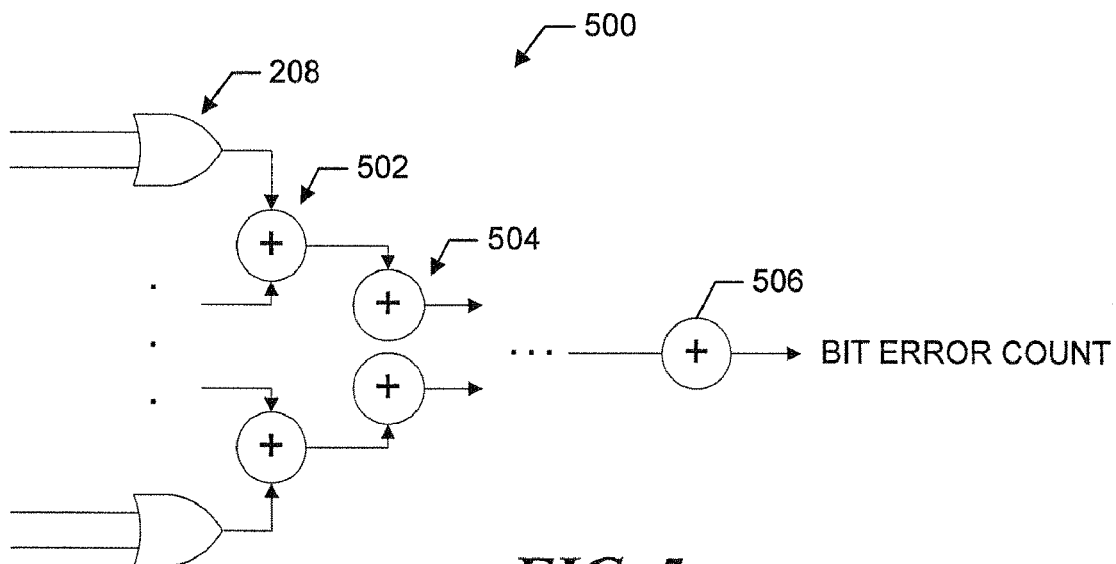
FIG. 5 is an adder tree that counts the bit errors.

Referring also to FIG. 5, the decoder includes an adder tree 500. The signals produced by the bit detectors 208 at the respective variable nodes are added into the tree through 1-bit associated adders 502, and a total bit error count is calculated through N/4 2-bit adders 504, N/8 four-bit adders (not shown), and so forth until a total count is determined in an adder 506. Alternatively, an accumulator or other counter may be used to determine the number of bit errors detected based on the output values of the N bit error detectors.

The bits may instead be grouped into n-bit symbols, and the decoder then produces an error count that corresponds to the number of symbols with errors. Thus, the bit detector output values, which correspond to the respective bits of the n-bit symbols, are combined to produce single values of 1 or 0 per symbol that indicate the presence or absence of errors within the respective symbols. These symbol error values are then added together to produce a total that is the equivalent of the number of symbols with errors metric that is produced, for example, by a Reed-Solomon code.

Figure 6:
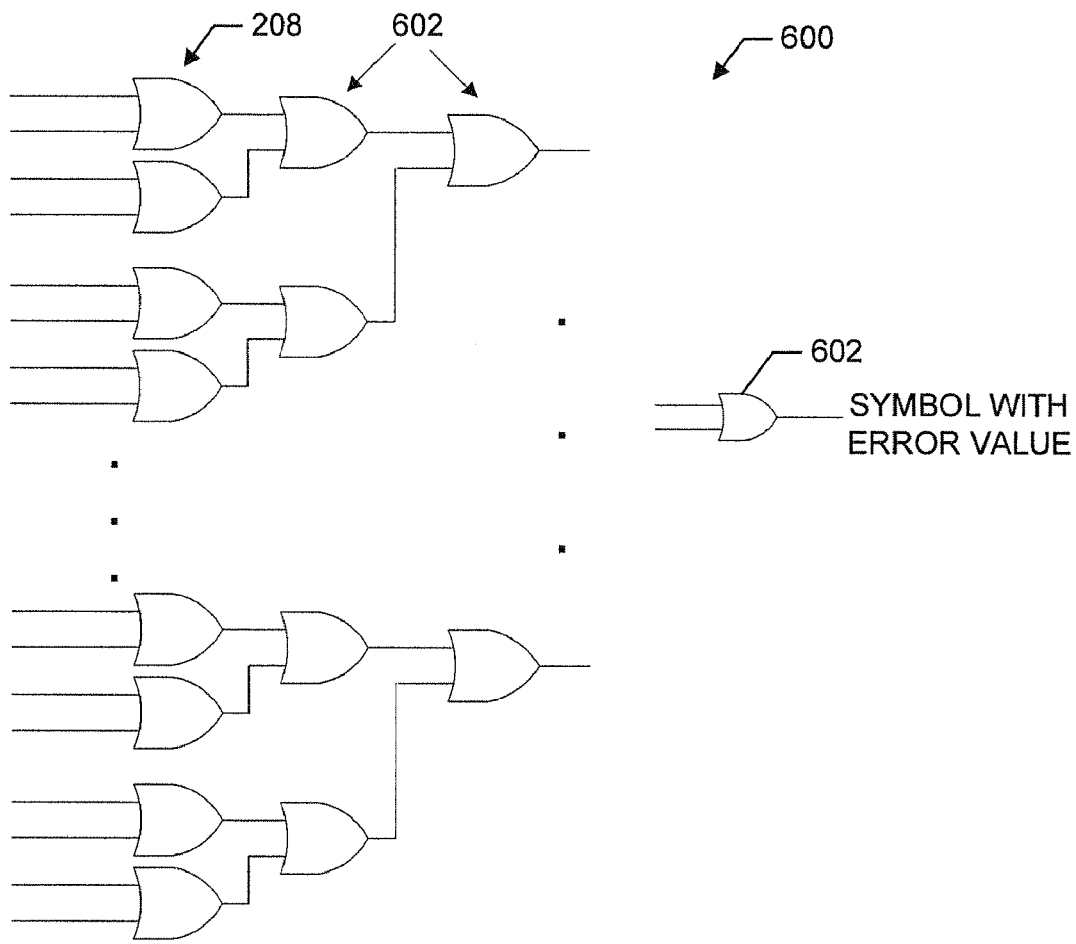
FIG. 6 is an adder tree that counts symbols with errors.

As shown in FIG. 6, an XOR subtree 600 is utilized to produce, from n bit error values, a symbol with error value. The sub-tree thus combines the output values from the bit error detectors 208 through interconnected XOR gates 602. The symbol with error values are then supplied to an adder tree 500 or an accumulator, to produce a count of the total number of symbols with errors for the block.

The foregoing description has been limited to a specific embodiment of this invention. It will be apparent, however, that variations and modifications may be made to the invention, with the attainment of some or all of its advantages. For example, the bit error detector may be a comparitor, XOR gate, adder, accumulator or other circuitry and the bit error detector and/or the adder tree may be implemented as software, hardware or firmware, the subtractor that produces the extrinsic information may be omitted from the variable node processor, counters may be used in place of the adder sub-trees, and so forth. Therefore, it is the object of the appended claims to cover all such variations and modifications as come within the true spirit and scope of the invention.

What is claimed is:

1. A bit error detector for use with an iterative decoder, the bit error detector including:
   one or more input lines for receiving at least a sign bit of an input symbol and a sign bit of a corresponding variable node sum;
   means for determining if the sign bit of the variable node sum and the sign bit of the input symbol are the same; and
   an output line that provides an error value signal if the sign bits differ.

2. The bit error detector of claim 1 wherein the means for determining is an exclusive-OR gate.

3. The bit error detector of claim 1 wherein the means for determining is an adder.

4. The bit-error detector of claim 1 wherein the means for determining is a comparitor.

5. An iterative decoder for decoding a plurality of bits, the decoder including
   a plurality of check nodes;
   a plurality of variable nodes that produce respective updated sign values that correspond to input symbols; and
   a plurality of bit error detectors that produce error values for the respective bits, the bit error detectors detecting bit errors for the respective bits for which the updated sign values differ from sign bits of the corresponding input symbols.

6. The iterative decoder of claim 5 wherein the bit error detectors are exclusive OR gates.

7. The iterative decoder of claim 5 wherein the input symbols are provided by a detector and consist of a sign bit and associated confidence information, and the variable nodes produce sums that include the updated sign values and associated confidence values.

8. The iterative decoder of claim 7 wherein the variable nodes provide the confidence information from the respective sums to the check nodes for a next iteration.

9. The iterative decoder of claim 5 further including an adder tree that produces a total bit count by adding together the bit error values produced by the bit error detectors.

10. The iterative decoder of claim 5 further including an accumulator that produces a total bit error count based on the bit error values produced by the bit error detectors.

11. A method for detecting bit errors in iterative decoding, the method including the steps of:
   A. processing respective input symbols that consist of at least sign bits to produce sums that consist of at least updated sign bits;
   B. producing bit error values if the sign bits of respective input symbols and the sign bits of the corresponding sums are different and counting the values to produce a count; and
   C. determining if convergence has occurred and if so using the count produced in step B as error count;
   D. if convergence has not occurred updating the sum and repeating steps B-D until either convergence or a stop condition occurs.

12. The method of claim 11 further including in the step of updating the sum
   processing the updated sign bits and associated confidence information in accordance with code constraints to produce associated messages, and
   further processing the input symbols and the associated messages to produce next updated sign bits and associated confidence information.

13. The method of claim 11 wherein the step of producing bit error values includes comparing the sign bits of respective input symbols and the corresponding sums.

14. The method of claim 11 wherein the step of producing bit error values includes exclusive OR'ing the sign bits of respective input symbols and the corresponding sums.

15. The method of claim 11 wherein the step of producing bit error values includes adding the sign bits of the respective input symbols and the corresponding sums.

16. The method of claim 11 further including the steps of
   determining if the error count exceeds a predetermined threshold, and
   if so, re-vectoring the data to another storage location.

17. The method of claim 11 wherein the step of counting includes adding together the bit error values.

18. The method of claim 16 wherein the step of counting the bit errors includes using an accumulator.

19. The method of claim 11 further including grouping the bits into n-bit symbols, producing error values for the respective symbols that include detected bit errors, and counting the error values to produce the error count.

20. The method of claim 19 further including the steps of determining if the count exceeds a predetermined threshold, if so, re-vectoring the data to another storage location.

* * * * *